(12) United States Patent
Hilt et al.

(10) Patent No.: US 8,367,940 B2
(45) Date of Patent: Feb. 5, 2013

(54) ENCAPSULATION DEVICE AND METHOD, MICROCAPSULE INCORPORATING THIS DEVICE

(75) Inventors: Thierry Hilt, Barraux (FR); Xavier Baillin, Crolles (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 249 days.

(21) Appl. No.: 12/872,251

(22) Filed: Aug. 31, 2010

(65) Prior Publication Data
US 2011/0052879 A1 Mar. 3, 2011

(30) Foreign Application Priority Data

Sep. 2, 2009 (FR) ...................................... 09 55975

(51) Int. Cl.
*H05K 1/16* (2006.01)
(52) U.S. Cl. ........................................ 174/260; 257/787
(58) Field of Classification Search .......... 174/255–260; 257/787
See application file for complete search history.

(56) References Cited

U.S. PATENT DOCUMENTS 6,870,258 B1 * 3/2005 Too ............................... 257/704
7,546,943 B2 * 6/2009 Barina et al. .................. 228/44.7

OTHER PUBLICATIONS

J.L. Pornin & al., "Wafer Level Thin Film Encapsulation of BOW RF MEMS" Cealeti, 57th ECTC, Jun. 2007.

* cited by examiner

*Primary Examiner* — Jeremy Norris
(74) *Attorney, Agent, or Firm* — Occhiuti Rohlicek & Tsao LLP (57) ABSTRACT

The invention concerns a device for encapsulating an element within a microcavity made on a support (10), this device comprising an encapsulating membrane (12) capable of forming at least one part of the microcavity,
characterized in that the device comprises at least one arm which mechanically attaches the membrane to the support, this arm being capable of bending so as to shift the membrane between:
an open position in which the membrane overhangs the element to be encapsulated and its periphery defines an aperture extending around the element to be encapsulated, and
a shut position in which the periphery of the encapsulation membrane rests on the support to obstruct this aperture.

20 Claims, 6 Drawing Sheets

ENCAPSULATION DEVICE AND METHOD, MICROCAPSULE INCORPORATING THIS DEVICE

CROSS-REFERENCE TO RELATED APPLICATIONS

Under 35 USC 119, this application claims the benefit of the Sep. 2, 2009 priority date of French Application No. FR0955975, the contents of which are hereby incorporated by reference in their entirety.

BACKGROUND OF THE INVENTION

The invention pertains to a device and a method for encapsulating an element within a microcavity made on a support. The invention also pertains to a microcapsule incorporating this encapsulation device.

The term "microcavity" herein designates a cavity whose width is at most 1 or 5 mm and whose height is at most 1 mm or 500 µm.

The term "element" herein designates a microcomponent as well as a material such as a liquid or a gas.

Microcomponents are electromechanical microsystems known as MEMS (microelectromechanical systems) or NEMS (nanoelectromechanical systems) as well as other microcomponents such as electronic, optical and optoelectronic microcomponents or biochips. Integrated circuits also come under the term "microcomponents".

Microcavities and microcomponents differ from cavities or macroscopic components also by their method of manufacture. These microcavities and microcomponents are made by using the same collective manufacturing methods as those used to make microelectronic chips. For example, microcavities and microcomponents are made out of wafers, for example wafers made of monocrystalline silicone or glass, machined by photolithography and etching (for example DRIE or deep reactive ion etching) and/or structured by epitaxial growth and deposition of metallic materials.

Through these manufacturing methods, the microcavities and microcomponents generally have machined parts in which at least one of the dimensions is of the order of one micrometer. The dimension of the order of one micrometer is generally lower than 200 µm and for example ranges from 1 to 200 µm.

It is very often necessary to house an element inside a microcavity in order to insulate it and protect from the external environment. To this end, there are various known encapsulation devices. These known devices comprise an encapsulation membrane capable of forming at least one part of the microcavity.

For example, an encapsulation device can be created by using an encapsulation method known as "thin film packaging" (TFP). This is a collective method of encapsulation and uses techniques commonly used to make microcomponents. To make an encapsulation device using the TFP method, is it necessary especially to:

make the microcomponent on a support,
deposit a sacrificial layer on the microcomponent,
deposit the encapsulation membrane on the sacrificial layer,
pierce release holes in the encapsulation membrane to discharge or remove the sacrificial layer,
remove the sacrificial layer by means of the release holes, and
plug the release holes to shut the microcavity created by the removal of the sacrificial layer.

In a method of this kind for making the encapsulation device, it is necessary to pierce holes in the encapsulation membrane. Then, it is necessary to plug these holes, and this may pollute the interior of the microcavity with, for example, residues of hole-plugging material.

Another type of encapsulation device is made by attaching a cap to the support. The cap is machined by the same techniques as those used to make the microcomponent. The cap is machined independently of the support to be encapsulated. Then, the cap is assembled on the support to form the microcavity in which the element to be encapsulated is received. This assembling operation is a complex one. For example, it requires that the cap be precisely positioned relative to the element to be encapsulated and then that the cap be sealed to the support.

The prior art presented here above is described in greater detail in the following document D1, the contents of which is herein incorporated by reference: J. L. Pornin & al, <<Wafer Level Thin Film Encapsulation for BOW RF MEMS>>, CEA-LETI, $57^{th}$ ECTC (Electronic Component and Technology Conference), June 2007.

SUMMARY OF THE INVENTION

The invention is aimed at proposing an encapsulation device that is simpler to make.

An object of the invention therefore is an encapsulation device comprising at least one arm which mechanically attaches the membrane to the support, this arm being capable of bending so as to shift the membrane between:

an open position in which the membrane overhangs the element to be encapsulated and its periphery defines an aperture extending around the element to be encapsulated, and
a shut position in which the periphery of the encapsulation membrane rests on the support to obstruct this aperture.

The term "fluid communication" refers to any exchange of material between the interior and the exterior of the cavity, the material being for example a liquid, a gas and/or a plasma.

Because of the above device, release holes do not need to be pierced into the encapsulation membrane. Instead, it is enough to shift the encapsulation membrane to its open position to place the interior of the microcavity in a state of fluid communication with the exterior. Since the encapsulation membrane is not pierced, there is no need to plug any release holes either. The risks that the interior of the microcavity might be polluted by residues of plugging material are therefore eliminated.

Nor does the above device call for the assembling of a cap made independently of the support. Indeed, to shut the microcavity, it suffices to shift the encapsulation membrane, already fixed to the support, to its shut position. This shutting operation is far less complex than is joining an independent cap to the support.

The embodiments of this encapsulation device may comprise one or more of the following characteristics:

the membrane defines the roof of the microcavity in the shut position;
the device also has actuation means associated partly with the membrane and partly with the support so that the membrane can be shifted between its open and shut positions;
the actuation means are chosen from among thermal, electrostatic, electromagnetic or piezoelectrical means alone or in combination;
the thermal actuation means comprise at least the arm attaching the encapsulation membrane to the support, this arm comprising at least two layers, at least partly superimposed, made out of materials with expansion coefficients so that, in response to a temperature variation, this arm bends and causes the encapsulation membrane to shift between its open and shut positions or vice versa;

the encapsulation membrane comprises at least two superimposed layers made out of materials whose expansion coefficients are chosen so that, at a temperature of use, the encapsulation membrane bulges so as to define a side wall and a roof of the microcavity in which the element is received;

the encapsulation membrane comprises at least two superimposed layers made of materials, of which at least one shows piezoelectrical properties, so that, for a given difference of potentials applied to said material, the encapsulated membrane bulges so as to define a side wall and a roof of the microcavity in which the element is received;

the material of the layer of the encapsulation membrane in contact with the microcavity is furthermore made of a getter material;

the device comprises at least one electrode, fixedly joined to the support, for heating the arm and/or the encapsulating membrane;

at least one of the layers of the arm and/or of the encapsulation membrane, made out of a material having an expansion coefficient different from the materials of the other layers, is a resistive material capable of dissipating electrical energy in the form of heat when crossed by a current, this layer thus forming the heating electrode, and the device comprises conductive tracks electrically connecting the layer of resistive material to connection terminals of a current source;

the encapsulation membrane has a circular edge centered on an axis of revolution and layers of the encapsulation membrane take this axis of revolution as their axis of rotational symmetry;

the encapsulation membrane has a polygonal edge and at least one of the layers of the encapsulation membrane is formed by:

an isotropic material having expansion coefficients or piezoelectric properties that are different along different directions of the plane of the membrane, or a material that is not uniformly distributed within said layer, this material being arranged in the layer so that the polygonal edge of the encapsulation membrane is in a plane in the shut position.

The embodiments of the encapsulation device furthermore have the following advantages:

using an arm formed by the superimposition of two layers with different expansion coefficients gives a simple mechanism for shifting the membrane between its open and shut positions, making the membrane out of materials with different expansion coefficients enables a side wall of the macrocavity to be made simply from a plane encapsulation membrane, using a material that is also a getter to make one of the layers of the membrane enables the use of the same layer to obtain both getter and bimetallic-strip functions, incorporating heating electrodes at the arm or membrane prevents the use of heating means that are external and independent of the support, incorporating a layer of resistive material, connected to supply terminals, into the arm or membrane makes it possible to obtain the heating electrode simply from one of the materials whose expansion coefficient is different from that of the materials of the other layer, the rotational symmetry of the layers of the membrane gives a shutting of the microcavity that is as impervious as possible without any need to resort to anisotropic materials, using a membrane whose edge is polygonal and in a plane in the shut position gives a microcavity whose side wall extends along a polygonal perimeter while at the same time giving a shutting of the microcavity that is as impervious as possible.

An object of the invention is also a microcapsule comprising an element received within a microcavity and the above encapsulation device.

An object of the invention is also a method for encapsulating an element within a microcavity made on a support, this method comprising the action of bending at least one arm that mechanically attaches an encapsulating membrane to the support to shift the encapsulation membrane between:

an open position in which the membrane overhangs the element to be encapsulated and its periphery defines an aperture that extends around the element to be encapsulated, and a shut position in which the periphery of the encapsulation membrane rests on the support to obstruct said aperture.

The embodiments of this encapsulation method may comprise one or more of the following characteristics:

the method comprises the modification of the temperature of the arm attaching the encapsulation membrane to the support so that, in response, this arm shifts/the encapsulation membrane between its shut and open positions;

the method comprises:

the making of the element to be encapsulated on the support, the depositing of a sacrificial layer on the element, and the making of the encapsulation membrane on the sacrificial layer, then the removal of the sacrificial layer to create the microcavity in which the element is received, and before or during the removal of the sacrificial layer, the shifting of the encapsulation membrane to its open position to facilitate the removal of the sacrificial layer, and after the removal of the sacrificial layer, the action of bending the arm to shift the encapsulation membrane to its shut position.

BRIEF DESCRIPTION OF THE DRAWINGS

The invention will be understood more clearly from the following description, given purely by way of a non-restrictive example and made with reference to the drawings of which:

FIG. 4 is a method of encapsulation to obtain the microcapsule of FIGS. 1 to 3, FIGS. 5 to 14 give a more detailed view of different steps of the encapsulation method.

In these figures, the same references are used to designate the same elements.

MORE DETAILED DESCRIPTION

Here below in this description, the characteristics and functions well known to those skilled in the art are not described in detail. In particular, for further information, reference can be made for example to the document D1.

Figure 1:
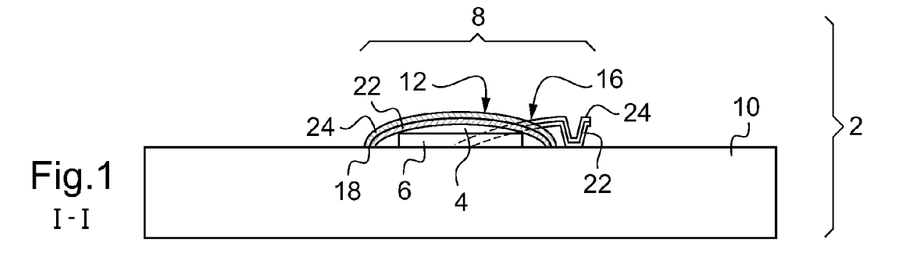
FIGS. 1 and 2, are illustrations in a sectional view of a microcapsule equipped with an encapsulation device.
Figure 2:
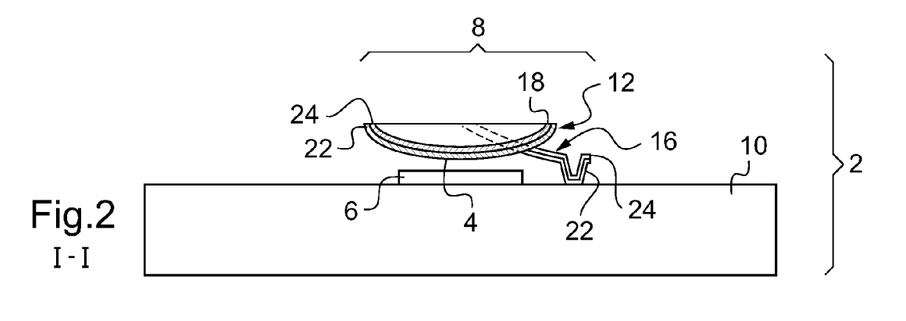
Figure 3:
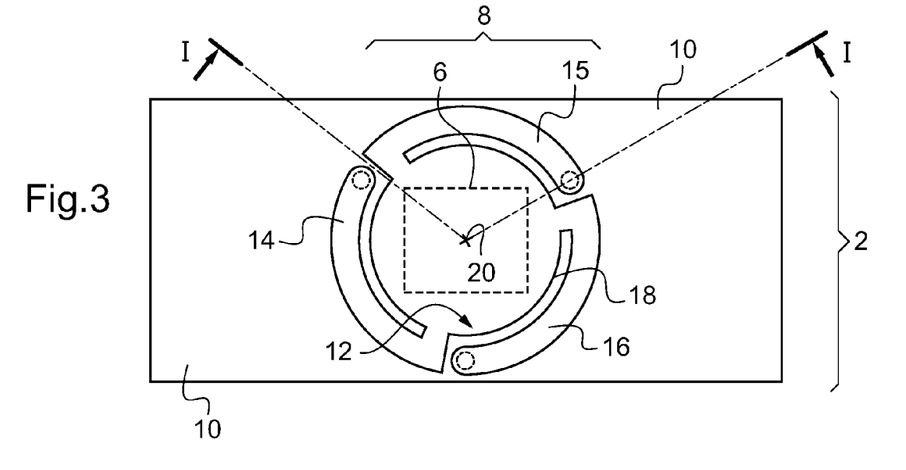
FIG. 3 is a schematic illustration in a top view of the microcapsule of FIGS. 1 and 2.

FIGS. 1 to 3 represent a microcapsule 2 comprising an element encapsulated in a microcavity 4. FIGS. 1 and 2 are a vertical section along the line I-I of FIG. 3.

The microcapsule 2 is described here in the special case where the element is a microcomponent 6 such as a MEMS.

The microcapsule 2 comprises an encapsulating device 8 for encapsulating the microcomponent 6 in the microcavity 4.

The device 8 comprises:
a support 10,
an encapsulation membrane 12, and
arms 14 to 16 for fixing the membrane 12 to the support 10.

The support 10 presents a horizontal upper face to which the microcomponent 6 is fixed. For example, the support 10 is made out of silicone or glass.

Here, the membrane 12 has the shape of a disk with a circular edge 18 centered on an axis 20 of revolution. The axis 20 is perpendicular to the upper face of the support 10. The axis 20 is centered on the microcomponent 6 to be encapsulated. For example, the axis 20 passes through the mass center of the microcomponent 6.

The membrane 12 is directly and permanently fixed to the support 10 by the three arms 14 to 16. Each arm has a first and a second end having a direct mechanical connection, respectively to the edge 18 and to the support 10. The first and second ends extend respectively essentially in the horizontal and vertical directions.

The membrane 12 can be shifted between:
an open position (FIG. 2) in which the interior of the microcavity 4 is in fluid communication with the exterior of the microcavity by means of an aperture, and
a shut position in which the encapsulation membrane 12 obstructs this aperture.

In the open position, the membrane 12 overhangs the element 6, and its periphery, i.e. in this case its edge 18, defines, with the support 10, an aperture that stretches around the element 6. Here, the aperture is deemed to extend around the element 6 if the orthogonal projection of the periphery of the membrane on the support 10 surrounds, preferably entirely, the element 6.

To this end, the arms 14 to 16 play the role of means for actuating shifts of the membrane 12 between its open and shut positions.

Furthermore, the membrane 12 can be deformed between:
a concave conformation curved towards the interior (FIG. 1) in which its edge 18 is turned to the support 10, and
a convex conformation curved outwards (FIG. 2) in which its edge 18 is turned to the opposite side.

In the concave conformation, the membrane 12 defines the side wall and the roof of the microcavity 4.

In this embodiment, the shifting of the membrane 12 between the shut and open positions and the passage of the membrane between the concave and convex conformations are actuated simultaneously by a same temperature variation. The shut position and the concave conformation are attained for a shutting temperature. For example, the shutting temperature is below 25° C. The open position and the convex conformation are attained for an opening temperature greater than the shutting temperature by at least 50° C. For example, the opening temperature is greater than 200° C. or 250° C.

To this end, the membrane 12 as well as the arms 14 to 16 behave like a bi-metallic strip. They are made by the superimposition of several layers each made out of a material whose expansion coefficient is different from that of the other layers. In this embodiment, the materials used are isotropic materials, i.e. their thermal expansion coefficient is the same whatever the direction considered. Furthermore, each material is uniformly distributed in the layer that it constitutes. Thus the layers are solid layers.

Here, the expansion coefficients of the materials of each layer diminish with distance from the microcomponent 6.

The membrane 12 is hermetically sealed with respect to the fluid to be imprisoned in the microcavity 4. For example, the membrane 12 is hermetically sealed to gas such as helium. Here, it is the materials of the layers that will make it possible to attain this degree of imperviousness.

By way of an illustration, the membrane 12 and the arms 14 to 16 are formed by only two superimposed layers 22 and 24. These layers are metal layers. For example, the layer 22 closest to the microcomponent 6 is made of titanium. The layer 24 stacked on the layer 22 is made of zirconium.

These materials, in addition to having different expansion coefficients, are also getters. These materials, when activated, have the property of absorbing the gas contained in the microcavity 4, enabling vacuum to be set up within this microcavity when it is hermetically sealed.

Figures 4, 5, 6:
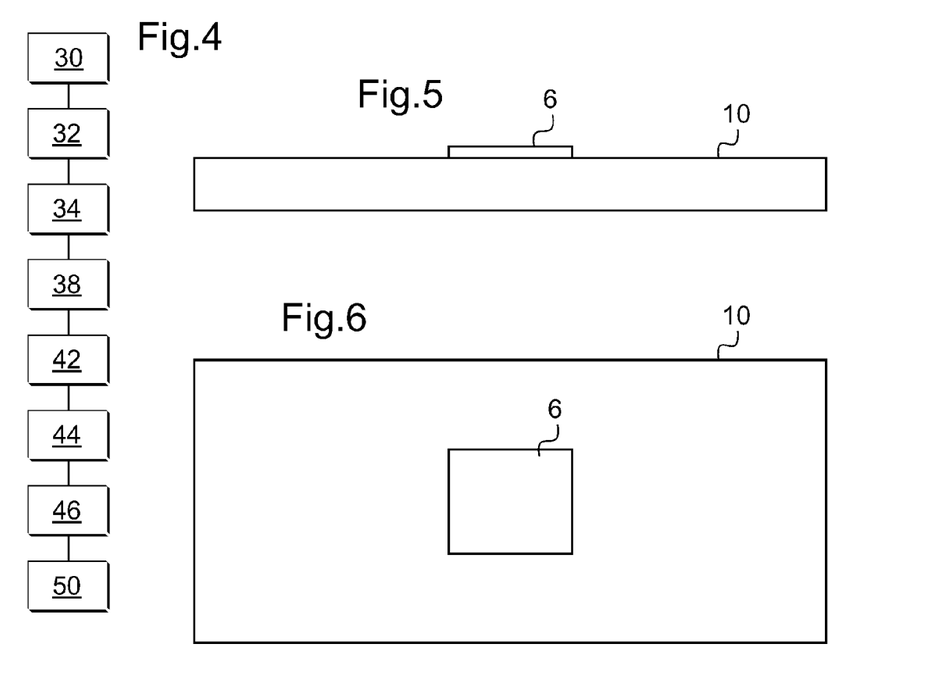

FIG. 4 represents a method for encapsulating an element within a microcavity to form the microcapsule 2.

Initially, at a step 30, the microcomponent 6 is made on the support 10. This step is made by means of a classic method for manufacturing microcomponents. This step also comprises, if necessary, a step for electrically insulating the component 6 relatively to the support 10.

FIGS. 5 and 6 represent the product obtained at the end of the step 30, respectively, in a side view and a top view.

Then, at a step 32, a sacrificial layer 34 (FIG. 7) is deposited on the entire surface of the microcomponent 6 and the support 10. For example, this sacrificial layer 34 is a layer of positive photosensitive resin. The thickness of this layer 34 is a few micrometers. For example, its thickness is smaller than or equal to 2 μm.

Figure 7:
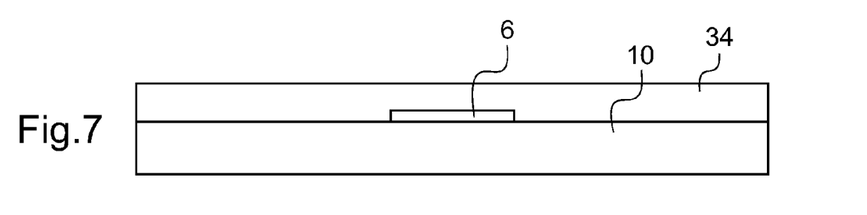
Figure 8:
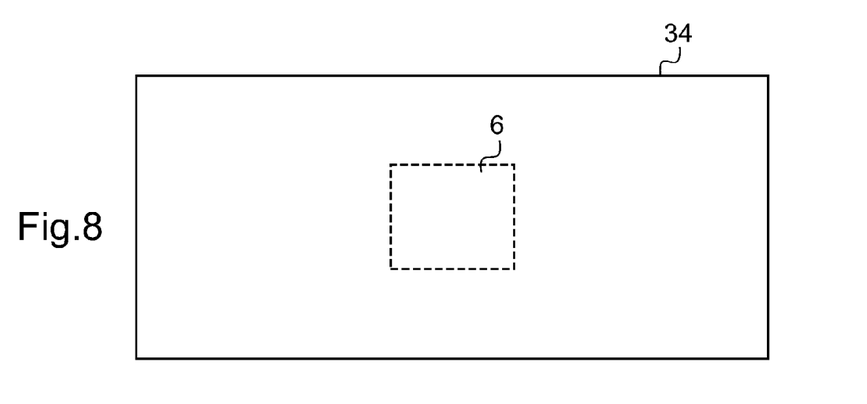

FIGS. 7 and 8 represent the product obtained at the end of the step 32, respectively in a side view and a top view.

Then, at a step 34, wells 36 (FIG. 9) designed to fix arms 14 to 16 to the support 10 are hollowed out in the sacrificial layer 34. The wells 36 are hollowed out up to the upper face of the support 10. For example, to this end, an operation of exposure of the sacrificial layer 34 is performed, followed by an operation of development.

Figure 9:
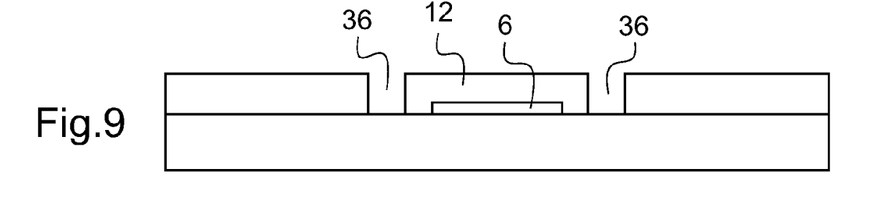
Figure 10:
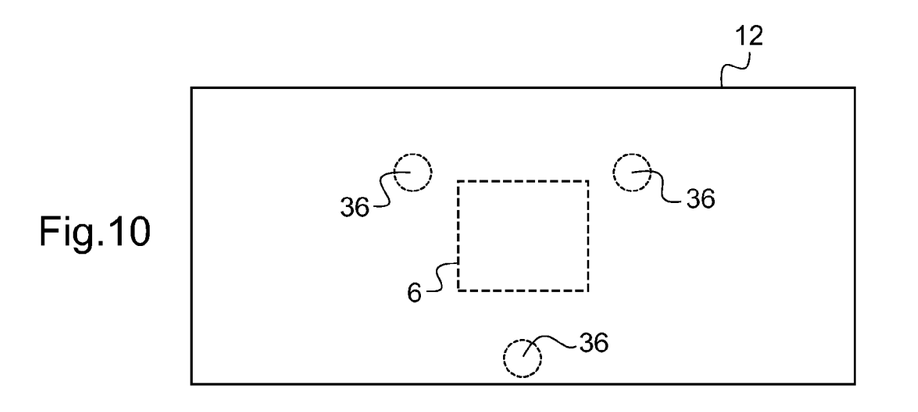

FIGS. 9 and 10 represent the product obtained at the end of the step 34, respectively in a side view and a top view.

Then, at a step 38, a film 40 (FIG. 11) is deposited on the entire surface of the sacrificial layer 34. This film 40 is also deposited on the bottom and the side walls of the wells 36. The film 40 is therefore fixed directly to the support 10 through the layer 34.

Figure 11:
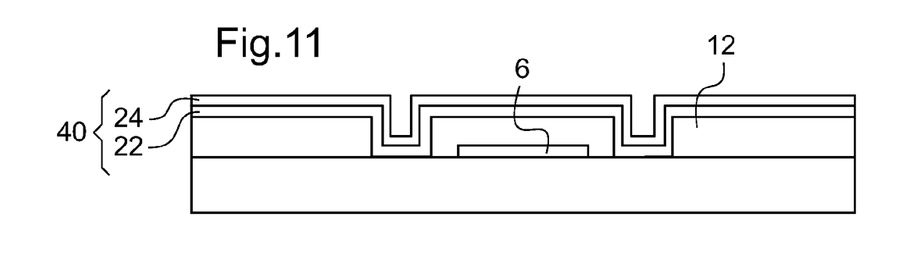

The film 40 is formed by the layers 22 and 24. The different layers of the film 40 are deposited at an intermediate temperature between the opening and shutting temperatures. Preferably, the intermediate temperature is equal to the mean of the opening and shutting temperatures plus or minus 20%. For example, the layers of the film 40 are deposited at a temperature of 125° C.

Figure 12:
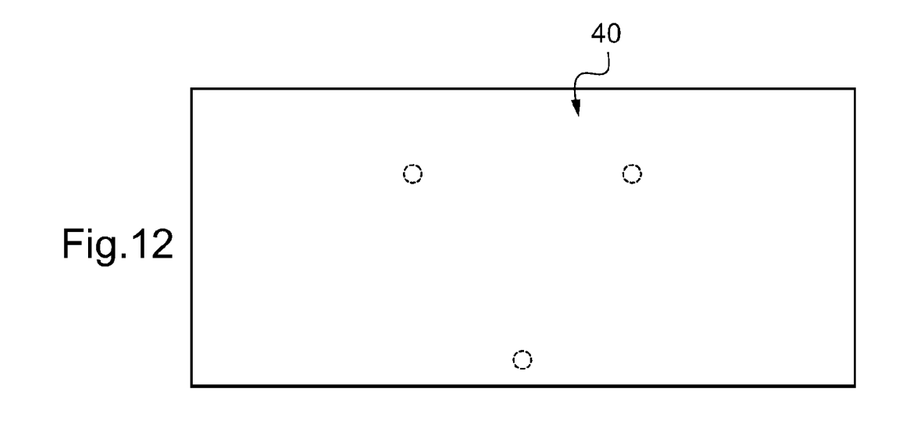

FIGS. 11 and 12 represent the product obtained at the end of the step 38 respectively in a side view and a top view.

Once the film 40 is deposited, at a step 42, it is etched to obtain the membrane 12 and the arms 14 to 16. The result obtained is shown in a top view in FIG. 13.

Figure 13:
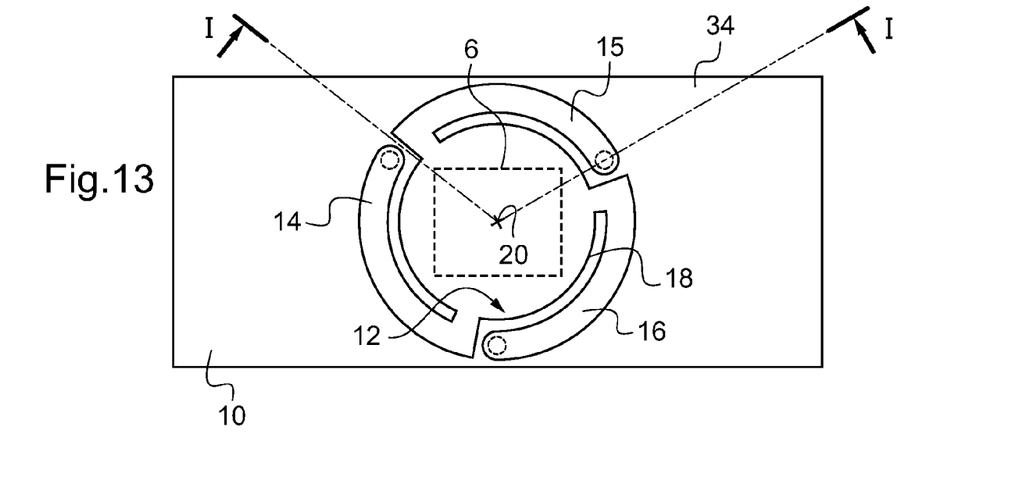
Figure 14:
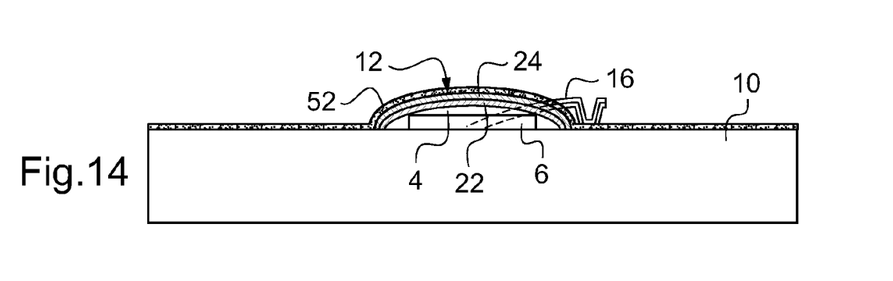

The film 40 is etched for example by means of conventional methods such as lithography and the etching of metals.

Then, at a step 44, the sacrificial layer 34 is removed. This step is carried out at the opening temperature. Thus, the encapsulation device is at the same time shifted to the open position shown in FIG. 2. However, FIG. 2 does not show the sacrificial layer 34 in the process of being removed.

Figure 15:
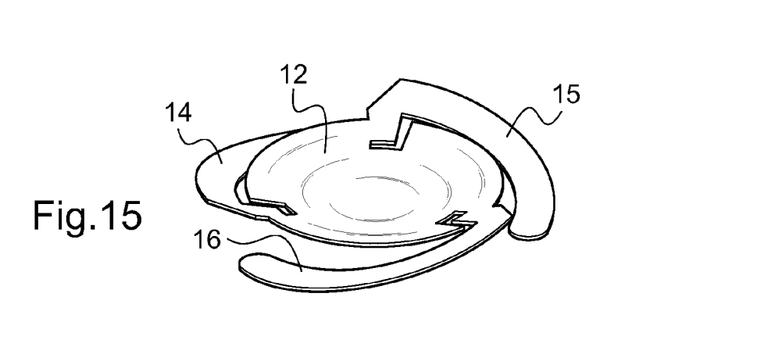
FIG. 15 is a schematic illustration in perspective of an encapsulation membrane in a convex conformation.

The sacrificial layer can be removed by plasma attack or by other methods such as chemical attack. Here, at the step 44, the sacrificial layer 34 is removed by plasma attack. The plasma attack heats the encapsulation device 8. Typically, at this step 44, the temperature reaches more than 200° or 250° C. Because of this heating, the layer 22 expands to a greater extent than the layer 24 so that the membrane 12 adopts the convex conformation. The convex conformation is also shown in a perspective view in FIG. 15. However, in this figure, to simplify the drawing, only the first ends of the arms 14 to 16 have been shown.

Furthermore, this temperature elevation also leads the arms 14 to 16 to bend in order to move the membrane 12 away from the microcomponent 6.

In the open position, the membrane 12 has big apertures situated between its edge 18 and the support 10 that facilitate the removal of the sacrificial layer 34.

Once the sacrificial layer has been removed, at a step 46, the membrane 12 is shifted from its open position to its shut position and from its convex conformation to its concave conformation.

To shift the membrane 12 up to its shut position, the temperature is brown down to the shutting temperature. At this temperature, the layer 22 is more retracted than the layer 24, causing the membrane 12 to adopt the concave conformation. At the same time, the arms 14 to 16 bend to shift the membrane 12 until the edge 18 is directly supported on the upper face of the support 10.

The microcavity 4 is obtained without any need to proceed, as in the prior-art, with the curing of a photosensitive resin in order to obtain this concave conformation of the encapsulation membrane. The fact of not having to cure the sacrificial layer also facilitates its removal during the step 44.

Once the membrane 12 is in its shut position and in its concave conformation, the microcavity 4 is definitively sealed at a step 50. For example, to this end, a layer 52 is deposited on the external face of the support 10 and the membrane 12 (FIG. 4) so as to hermetically seal the microcavity 4. For example, the layer 52 is made out of a material that is hermetically sealed to helium.

Preferably, the material chosen to make the layer 52 also has high mechanical rigidity so as to increase the mechanical rigidity of the walls forming the microcavity 4. For example, it will be a metal layer. This metal layer can be deposited by electrochemical deposition (ECD) or in two steps. The first step is a step for spraying the metallic material on the external surface of the membrane 12 of the support 10. The second step is a step for growing the metallic material by electrolytic growth.

Figure 16:
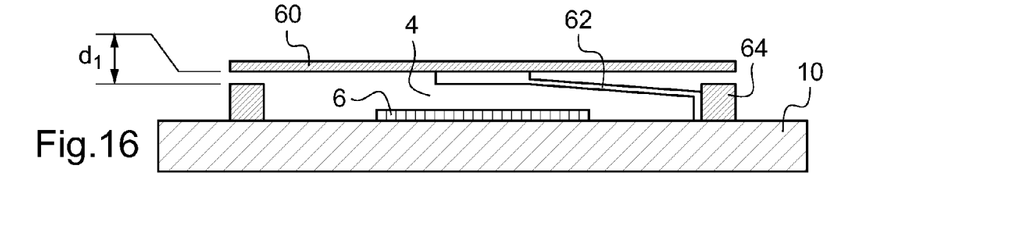
FIGS. 16 and 17 are a schematic illustration of a second embodiment of an encapsulation device in an open and shut position respectively.
Figure 17:
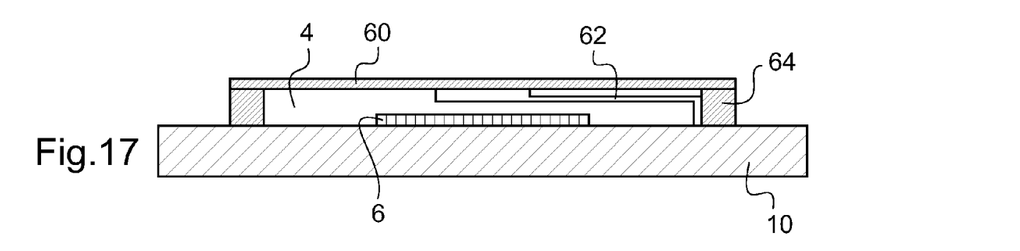

Many other embodiments are possible. For example, FIGS. 16 and 17 represent an embodiment in which the membrane 12 and the arms 14 to 16 are replaced respectively by a membrane 60, one or more arms 62 and a wall 64 surrounding the microcomponent 6. To simplify FIGS. 16 and 17, only one arm 62 is shown.

The wall 64 extends essentially vertically to form a vertical wall surrounding the microcomponent 6. The base of the wall 64 is hermetically fixed without any degree of freedom on the support 10. The wall 64 does not bend in response to temperature changes. To this end, it is made out of one and the same material. The wall 64 forms part of the support 10.

The membrane 60 is a plane membrane and extends essentially in a horizontal plane. Here, the membrane 60 does not bend in response to changes in temperature. For example, the membrane 60 is entirely made out of the same material. The material used for the membrane 60 is the same as that used to make the side wall 64.

The membrane 60 is fixed to the support 10 by means of the arm 62. This arm 62 has several layers superimposed on one another, made out of materials having different expansion coefficients so as to bend in response to a change in temperature. The arm 62 is shaped so as to shift the membrane 60 between an open position (FIG. 16) and a shut position (FIG. 17) in response to variation in temperature. In the open position, the membrane 16 is spaced out from the wall 64 by a distance $d_1$ so as to make an aperture setting up fluid communication between the interior of the microcavity 40 and the exterior. This aperture surrounds the element 6. In the shut position, the arm 16 gets deformed so as to bring the membrane 60 in a supporting position on the upper part of the wall 64 and thus to rest on the support. In this position, the space having a width $d_1$ is eliminated and the microcavity 4 is shut.

If a definitive, hermetical sealing is desired in the shut position, then a sealing layer such as the layer 52 is deposited on the membrane 60 and on the support 10.

In this embodiment, it is not necessary for the membrane 60 to bend in order to form the side wall of the microcavity 4. However, this can also be done as a complement to the wall 64.

Figure 18:
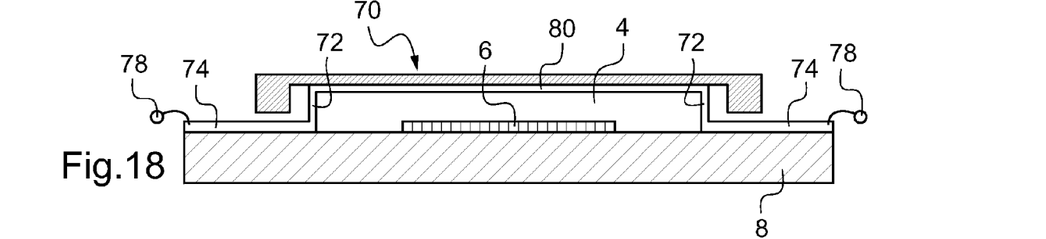
FIGS. 18 and 19 are schematic illustrations of a third embodiment of an encapsulation device, respectively in its open and shut positions.
Figure 19:
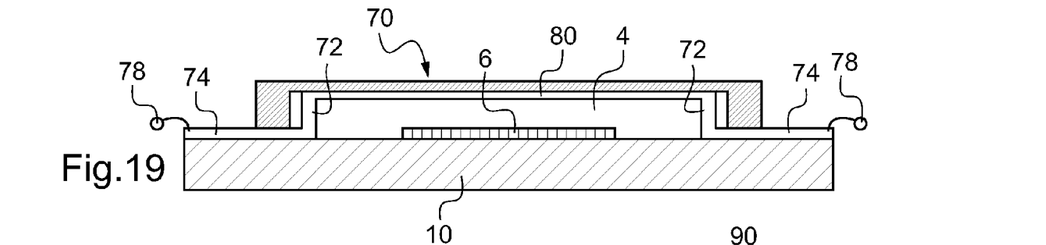

The shifts of the encapsulation membrane can be actuated by other actuating means. For example, FIGS. 18 and 19 represent an embodiment in which the membrane 12 and the feet 14 to 16 are respectively replaced by a membrane 70 and feet 72 made out of piezoelectrical material.

In this embodiment, the membrane 70 can be shifted between an open position (FIG. 18) and a shut position (FIG. 19) in response to the deformation of the arms 72. Here, the deformation of the arms 72 consists in making them recline in varying degrees in the vertical direction. To simplify FIGS. 18 and 19, only two arms 72 have been shown.

Here, the deformation of the arms 72 is controlled by applying a difference of voltage between the ends of these arms. To these ends, the lower ends of the arms 72 are connected to conductor tracks 74 whose ends are themselves connected to terminal 78 providing a connection to a power supply source. The upper ends of the arms 72 for their part are electrically connected to each other by means of a track 80 fixedly joined to the membrane 70.

In this embodiment, the membrane 70 does not bend in response to temperature variations. It is made for example out of one and the same material. Here, the membrane 70 is shaped to define both the roof and the side wall of the microcavity 4.

In another embodiment, the arms 72 are replaced by arms having at least two layers with at least two partly superimposed parts. The material of at least one of these layers has piezoelectrical properties to enable the creation of mechanical stresses in response to the application of a difference in potentials to this material. These mechanical stresses shift the membrane between its open and shut positions. For example, these mechanical stresses curve the arms 72.

The membrane 70 can also be replaced by a membrane having at least one layer of piezoelectrical material so that in response to the application of a difference in potentials, it bends to form the roof and at least one part of the side wall of the microcavity 4. For example, the membrane has at least two superimposed layers, at least one of them made of a material having piezoelectric properties.

Figure 20:
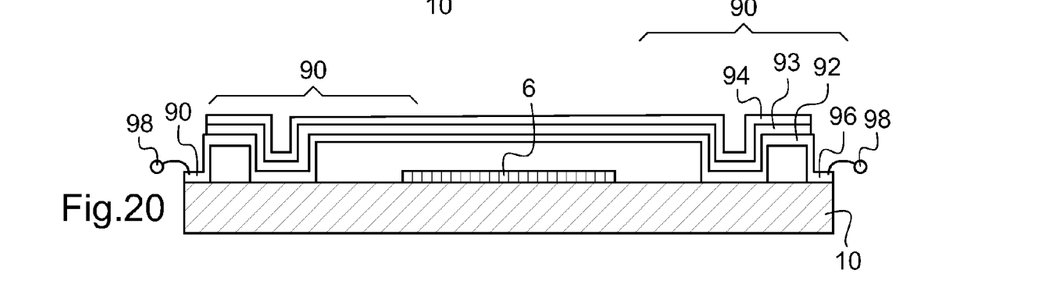
FIG. 20 is a schematic illustration of a fourth embodiment of an encapsulation device.

FIG. 20 is a particular embodiment in which the arms are formed by a stack of more than two layers. To simplify FIG. 20, the encapsulating membrane has not been shown and only two arms 90 are schematically illustrated in a section view to the right and to the left of the microcomponent 6. These arms 90 are herein formed by the stacking of three successive layers 92, 93 and 94. The expansion coefficients of the layers 92 to 94 increase with distance from the microcomponent 6. An embodiment of this kind limits shear stresses existing at the interface between each of the layers 92 to 94.

Furthermore, here, at least one of the layers is made out of a resistive material capable of getting heated when it is crossed by an electrical current. This layer then additionally fulfils the function of a heating electrode. For example, the layer 92 is made out of this resistive material. To this end, this layer 92 is connected by means of tracks 96 to terminals 98 providing connection to a power supply source. Thus, to actuate the arms 90, it is enough to let through an electrical current into the resistive layer 92.

As a variant, the layer 92 does not take part in the working of the bimetallic strip. In this case, the expansion coefficient of the material layer 92 is identical or very close to the expansion coefficient of the material of the layer 93. This layer 92 therefore fulfils only the function of a heating electrode for the arm 90.

Thus, in the embodiment of FIG. 20, it is not necessary to raise the temperature of the entire surroundings of the arms 90 to obtain the shifting of the encapsulation membrane between its open and shut positions.

The layer of resistive material can also be incorporated into the encapsulation membrane so as to form a heating electrode to heat this encapsulation membrane.

There are many other possible embodiments of the means for actuating shifts of the membrane between its open and shut positions. Preferably, these means are at least partly incorporated into the actuating arms. For example, the shifts are actuated electrostatically. In such an embodiment, the electrode fixed to the membrane or the arms is positioned at least partly so as to be facing another electrode fixed to the support 10. By modifying the polarity of these electrodes by means of a power supply, it is possible to execute a repulsive or attraction force enabling the membrane to be shifted between its open and shut positions. For example, a difference in potentials is applied between these electrodes to polarize the electrodes.

In another embodiment, means of magnetic actuation are used to shift the membrane. For example, the actuation means comprise at least one electrode positioned on the arm of the membrane and magnetic induction means positioned on the support at least partly facing the electrode. The induction means create a magnetic field to shift the membrane between its open and shut positions. It is also possible to invert the positions of the electrodes and the induction means. In this case, the induction means are borne by the arms.

The actuation means can also be made with magnets. For example, permanent magnets having opposite polarities and facing each other are fixed on one side to the membrane and/or the arm and on the other side to the support 10. To attract or repel these magnets, it is possible to use the fact that these magnets lose their magnetization beyond their respective Curie temperatures.

The encapsulation membrane can also be shifted between its open and shut positions by arms made out of shape memory materials. Thus, in this embodiment, it is the shape memory of these materials that is used to actuate the shifting of the membrane rather than a difference in expansion coefficients. The switching from one shape of the material to another can be controlled by a change in temperature.

It is not systematically necessary for the vertical end of the arms to get curved or deformed. Thus, this vertical end can be made differently from the horizontal end. For example, the vertical end is made out of a single material.

It is not indispensible for the layer or layers of the encapsulation membrane to be made out of a getter material.

Nor is it necessary for the material of each layer to be uniformly spread within this layer.

In other embodiments, the membrane has a polygonal edge to make a side wall of the microcavity extending along a polygonal perimeter. To obtain a shutting that is as hermetically sealed as possible, the edge of the encapsulation membrane must however be in a same plane parallel to the upper face of the support in its shut position. This requires that the expansion distances should not be the same along all the directions of the plane of the encapsulation membrane. To this end, several solutions are possible. First of all, the material used to make one or more layers of the encapsulation membrane has an anisotropic expansion coefficient. Anisotropic material of this kind has an expansion coefficient that differs according to the direction considered. For example, a material may be orthotropic, i.e. it may have only two orthogonal directions along which its expansion coefficient differs. An orthotropic material can be used to make one or more layers of a rectangular encapsulation membrane. In this embodiment, the direction of the greatest expansion of material is parallel to the smallest side and the direction with the smallest expansion is parallel to the greatest side. Thus, in the shut position, the edge of the encapsulation membrane is in a plane in contact with the upper face of the support.

Figure 21:
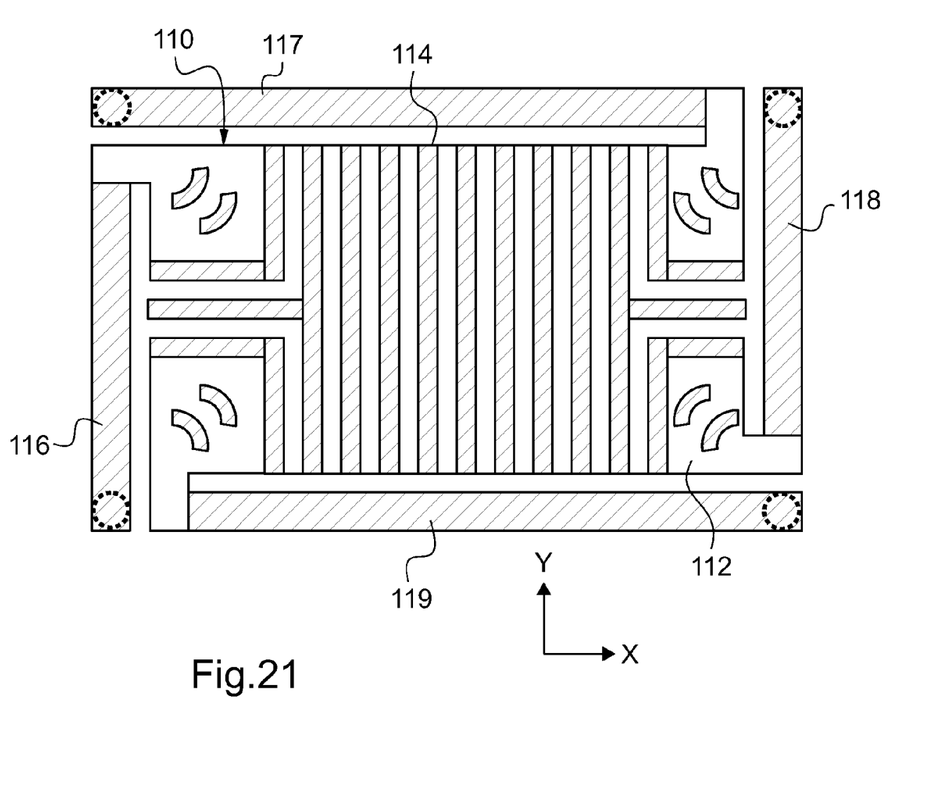
FIG. 21 is a schematic illustration of another possible embodiment of an encapsulation membrane.

A second approach lies in the use of an isotropic material that is not uniformly distributed in one or more layers of the encapsulation membrane. FIG. 21 shows an encapsulation membrane 110 made according to this second approach. The membrane 110 is rectangular. Its greatest and smallest sides extend respectively in parallel to directions X and Y. The membrane 110 has a layer 112 made out of an isotropic material. The isotropic material is uniformly spread in the layer 112 and therefore forms a full layer. On this layer 112, a layer 114 (shown in a hatched view in FIG. 21) is superimposed. The layer 114 is made out of an isotropic material that is not uniformly spread in the layer 114. Here, the layer 114 has been apertured at certain places. The apertures make the expansion of the layer 114 not identical in the directions X and Y. The apertures made in the layer 114 are sized and positioned so that the rectangular edge of the encapsulation membrane is in a plane in the shut position.

In FIG. 21, only the first ends of the four arms 116 to 119 for fixing the membrane 110 to a support have been shown.

Depending on the applications in view, the step 50 for hermetically sealing the microcavity may be performed or not performed. This sealing is aimed especially at ensuring that the fluid contained in the microcavity is hermetically sealed. In particular, this is a step for hermetically sealing the zone of contact between the periphery of the membrane and the support. This hermetic sealing can be done in many different ways. For example, a titanium layer or a layer of a polymer resin or any other hermetically sealing material can be deposited on the membrane to provide for this hermetic sealing.

The encapsulation device has been described in the particular case in which a microcomponent is encapsulated. However, all sorts of elements can be encapsulated in the microcavity thus formed by the encapsulation device. In particular, liquids may be encapsulated by means of this encapsulation device. To this end, once the encapsulation device has been made in accordance with the method of FIG. 1, the entire device is dipped into the liquid to be encapsulated and then the membrane is shifted from its open position to its shut position so as to encapsulate a fraction of the liquid inside the microcavity.

The invention claimed is:

1. A device for encapsulating an element within a microcavity made on a support, the device comprising
   an encapsulate on membrane capable of forming at least one part of the microcavity,
   at least one arm that mechanically attaches the encapsulation membrane to the support, the arm being capable of bending so as to shift the encapsulation membrane between:
      an open position in which the encapsulation membrane overhangs the element to be encapsulated and a periphery of the encapsulation membrane defines an aperture extending around the element to be encapsulated, and
      a shut position in which the periphery of the encapsulation membrane rests on the support to obstruct the aperture.

2. The device according to claim 1, wherein, in the shut position, the encapsulation membrane defines a roof of the microcavity.

3. The device according to claim 1, further comprising actuation means associated partly with the encapsulation membrane and partly with the support so that the encapsulation membrane can be shifted between the open and shut positions.

4. The device according to claim 3, wherein the actuation means is chosen from a group consisting of thermal means, electrostatic means, electromagnetic means, piezoelectrical means, and any combination thereof.

5. The device according to claim 4, wherein the thermal actuation means comprises at least the arm attaching the encapsulation membrane to the support, the arm having at least two layers, at least partly superimposed, the two layers being made of materials with different expansion coefficients so that, in response to a temperature variation, the arm bends and causes the encapsulation membrane to shift between the open and shut positions or vice versa.

6. The device according to claim 5, further comprising at least one heating electrode, fixedly joined to the support, for heating at least one of the arm and the encapsulation membrane.

7. The device according to claim 6, wherein:
   at least one of the layers of the arm and/or of the encapsulation membrane comprises a resistive material capable of dissipating electrical energy in the form of heat when carrying a current, the layer thus forming the heating electrode, and
   the device further comprises conductive tracks electrically connecting the layer of resistive material to connection terminals of a current source.

8. The device according to claim 1, wherein the encapsulation membrane comprises at least two superimposed layers made of materials having expansion coefficients chosen so that, at a temperature of use, a bulge in the encapsulation membrane defines a side wall and a roof of the microcavity in which the element is received.

9. The device according to claim 8, wherein the material of the layer of the encapsulation membrane in contact with the microcavity comprises a getter material.

10. The device according to claim 8, wherein the encapsulation membrane has a circular edge centered on an axis of revolution, said axis of revolution being an axis of rotational symmetry for layers of said encapsulation membrane.

11. The device according to claim 8, wherein the encapsulation membrane has a polygonal edge, and wherein at least one of the layers of the encapsulation membrane is formed by a material selected from the group consisting of:
   an anisotropic material having expansion coefficients or piezoelectric properties that are different along different directions of the plane of the encapsulation membrane, and
   a material that is not uniformly distributed within said layer,
   wherein the material is arranged in the layer so that the polygonal edge of the encapsulation membrane is in a plane in the shut position.

12. The device according to claim 8, further comprising at least one heating electrode, fixedly joined to the support, for heating at least one of the arm and the encapsulation membrane.

13. The device according to claim 1, wherein the encapsulation membrane comprises at least two superimposed layers made of materials, of which at least one is a piezoelectric material, so that, for a given difference of potentials applied to said material, a bulge that forms in the encapsulation membrane defines a side wall and a roof of the microcavity in which the element is received.

14. The device according to claim 13, wherein the material of the layer of the encapsulation membrane in contact with the microcavity comprises a getter material.

15. The device according to claim 13, further comprising at least one heating electrode, fixedly joined to the support, for heating at least one of the arm and the encapsulation membrane.

16. The device according to claim 13, wherein the encapsulation membrane has a circular edge centered on an axis of revolution, said axis of revolution being an axis of rotational symmetry for layers of said encapsulation membrane.

17. A microcapsule comprising
   an element received within a microcavity; and
   an encapsulation device for encapsulating the element within the microcavity made on a support, the encapsulation device including:
      an encapsulation membrane capable of forming at least one part of the microcavity,
      at least one arm that mechanically attaches the encapsulation membrane to the support, the arm being capable of bending so as to shift the encapsulation membrane between:
         an open position in which the encapsulation membrane overhangs the element to be encapsulated and its periphery defines an aperture extending around the element to be encapsulated, and
         a shut position in which the periphery of the encapsulation encapsulation membrane rests on the support to obstruct the aperture.

18. A method for encapsulating an element within a microcavity made on a support, said method comprising
   bending at least one arm that mechanically attaches an encapsulation membrane to the support to shift the encapsulation membrane between:
      an open position, in which the encapsulation membrane overhangs the element to be encapsulated and a periphery of the encapsulation membrane defines an aperture that extends around the element to be encapsulated, and
      a shut position, in which the periphery of the encapsulation membrane rests on the support to obstruct said aperture.

19. The method according to claim 18, further comprising modify the temperature of the arm attaching the encapsulation membrane to the support so that, in response, the arm shifts the encapsulation membrane between its shut and open positions.

20. The method according to claim 18, further comprising:
   making the element to be encapsulated on the support,
   depositing a sacrificial layer on the element,
   making the encapsulation membrane on the sacrificial layer,
   removing the sacrificial layer to create a microcavity for receiving the element, and
   before or during the removal of the sacrificial layer, shifting the encapsulation membrane to the open position to facilitate removal of the sacrificial layer, and
   after removal of the sacrificial layer, bending the arm to shift the encapsulation membrane to the shut position.

* * * * *